United States Patent [19]

Bertotti et al.

[11] Patent Number: 4,663,647
[45] Date of Patent: May 5, 1987

[54] BURIED-RESISTANCE SEMICONDUCTOR DEVICE AND FABRICATION PROCESS

[75] Inventors: Franco Bertotti, Milan; Paolo Ferrari, Gallarate; Luigi Silvestri; Flavio Villa, both of Milan, all of Italy

[73] Assignee: SGS Microelettronica SpA, Milan, Italy

[21] Appl. No.: 779,091

[22] Filed: Sep. 23, 1985

[51] Int. Cl.$^4$ .................. H01L 27/02; H01C 1/012
[52] U.S. Cl. ..................................... 357/51; 357/91; 338/314
[58] Field of Search .............. 357/22 F, 22 G, 22 R, 357/51, 91; 338/308, 314

[56] References Cited

U.S. PATENT DOCUMENTS 3,615,932 10/1971 Makimoto et al. .................. 357/51
4,258,311 3/1981 Tokuda et al. ...................... 357/51

OTHER PUBLICATIONS

Shutler "Fusible Pinch Resistor" *IBM Technical Disclosure Bulletin* vol. 13 (6/70) p. 57.

Wiedmann "Monolithic Resistor Structure" *IBM Technical Disclosure Bulletin* vol. 13 (10/70) p. 1316.
Samson "Obtaining High Resistance in Integrated Circuits" *IBM Technical Disclosure Bulletin* vol. 13 (1/71) p. 2151.

*Primary Examiner*—Gene M. Munson
*Attorney, Agent, or Firm*—Wenderoth, Lind & Ponack

[57] ABSTRACT

A buried-resistance semiconductor device is constructed by forming a P-type monocrystalline silicon substrate on which an epitaxial layer of silicon doped with type N impurities is grown, a portion of the epitaxial layer being insulated by a P-type insulating region extending from the substrate to the surface of the epitaxial layer. Two suitably-spaced terminals are secured to the surface of the epitaxial layer in the area bounded by the insulating region. Two separation regions extending into the surface layer are formed in the part of the epitaxial layer between the terminals, and a buried region extends from the substrate between the separation regions without being in contact with them. The three regions are of P-type material, and have an elongated shape and are bounded at the ends by the insulating region.

1 Claim, 2 Drawing Figures

BURIED-RESISTANCE SEMICONDUCTOR DEVICE AND FABRICATION PROCESS

BACKGROUND OF THE INVENTION

The present invention relates to "buried-resistance" semiconductor devices, more particularly to those devices used in integrated circuits as resistors having a high resistance and very small bulk, or used as constant-current generators.

The devices, also described in the technical literature as "tunnel-resistance" devices, are normally made by forming a monocrystalline silicon substrate having a first type of conductivity, generally P type, growing an epitaxial layer having a second type of conductivity, generally N type, on the substrate, and insulating a portion of the epitaxial layer by an insulating region extending from the substrate to the surface of the epitaxial layer, the insulation region having the first type of conductivity. Two terminals suitably spaced apart are secured to the surface of the epitaxial layer in the area bounded by the insulating region.

The resistivity and thickness of the epitaxial layer and the distance between the terminals determine the total electrical resistance between the two terminals when a voltage is applied therebetween.

When the applied voltage increases, the resistance remains constant, i.e. there is an ohmic-type relationship between the voltage and the current flowing in the device up to a threshold value of the voltage, above which the current remains constant when the applied voltage increases, so that the device acts as a constant current generator.

The reasons this happens is that a depletion region of majority carriers forms in the epitaxial layer at the junction with the substrate, which is maintained at a reference voltage, the extent of the depletion region increasing with the applied voltage, particularly in the region underneath the terminal at the higher potential.

When the voltage reaches a threshold value $V_{PINCH}$ corresponding to the state of complete depletion of the epitaxial layer, the current in the device cannot be increased and therefore remains constant even when the applied voltage increases.

SUMMARY OF THE INVENTION

The object of the present invention is to construct a buried-resistance semiconductor device for use in integrated circuits which, as compared with the known devices, can give higher resistances for a given integration area without requiring additional steps in the manufacturing process.

Another object of the present invention is to reduce the voltage threshold at which the buried-resistance device behaves as a constant current generator.

This object may be obtained by providing the buried-resistance semiconductor device and process defined and characterized in the claims at the end of the present description.

This object may be achieved by providing a buried-resistance semiconductor device having two terminals formed in a chip of semiconductor material, said device comprising: a substrate having a first type of conductivity and bounded by a first main surface of said chip; a layer having a second type of conductivity disposed on said substrate and bounded by a second main surface of said chip two contact zones on which said two terminals are disposed being defined in a surface portion of said layer; an insulating region having said first type of conductivity extending from said substrate to said second main surface of said chip and bounding a portion of said layer extending from said substrate to said second surface of said chip; wherein, in part of said layer located between said two contact zones are at least two separation regions having said first type of conductivity and extending from said second main surface of said chip into said layer; and wherein, a buried region is provided having said first type of conductivity and extending from said substrate to a predetermined extent between said separation regions without being in contact with them, said separation regions and said buried region having an elongated shape and being bounded at their ends by said insulating region.

This object may be further achieved by effecting a process for manufacturing a buried-resistance semiconductor device having two terminals formed in a chip of semiconductor material, said device comprising: a substrate having a first type of conductivity and bounded by a first main surface of said chip; a layer having a second type of conductivity disposed on said substrate and bounded by a second main surface of said chip, two contact zones on which said two terminals are disposed being defined in a surface portion of said layer; an insulating region having said first type of conductivity extending from said substrate to said second main surface of said chip and bounding a portion of said layer extending from said substrate to said second surface of said chip; wherein, in part of said layer located between said two contact zones are at least two separation regions having said first type of conductivity and extending from said second main surface of said chip into said layer; and wherein a buried region is provided having said first type of conductivity and extending from said substrate to a predetermined extent between said separation regions without being in contact with them, said separation regions and said buried regions having an elongated shape and being bounded at their ends by said insulating region, said process comprising the steps of:

forming said layer having said second type of conductivity by epitaxially growing said layer on said substrate;

forming said insulating region in said layer by first ionically implanting impurities having the first type of conductivity in predetermined areas of the substrate prior to epitaxial growing said layer, said impurities being diffused into said layer during its epitaxial growth and depositing in predetermined areas of said second main surface of said chip bounding said layer impurities of the first type of conductivity, said impurities being diffused into said layer;

wherein said separation regions are respectively formed by said ionic implantation and diffusion steps forming said insulating region.

BRIEF DESCRIPTION OF THE DRAWINGS

The present invention will be more clearly understood from the following detailed description, given by way of example only and therefrom non-limitative, with reference to the accompanying drawings in which.

In the drawings, like letters and numbers denote like parts.

DESCRIPTION OF THE PREFERRED EMBODIMENT

Figure 1:
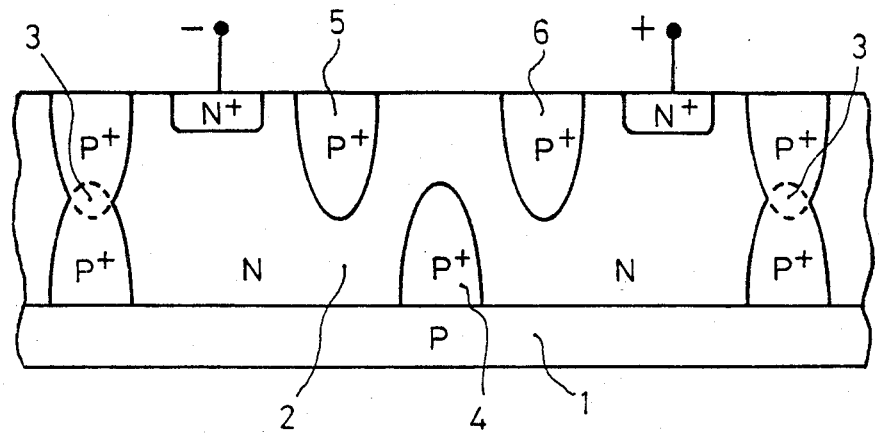
FIG. 1 shows an enlarged scale vertical section through a buried-resistance device according to the present invention.

As shown in FIG. 1, a device according to the invention is formed on a monocrystalline silicon substrate 1 doped with P-type impurity, e.g. boron, on which a silicon epitaxial layer 2 doped with N-type impurity, e.g. phosphorus, is grown. Two contact zones having a higher concentration of impurity, indicated by the symbol N+ in FIG. 1, are defined on the surface part of the epitaxial layer and contain two metal terminals indicated by "+" and "−", both in ohmic contact with the epitaxial layer 2 via the contact zones underneath.

Figure 2:
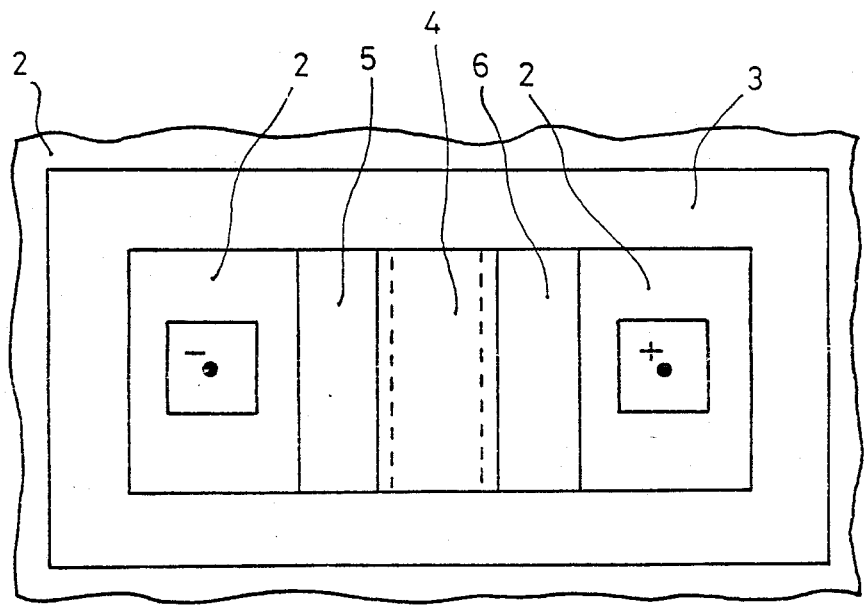
FIG. 2 is a plan view of the same device on the same enlarged scale.

As shown in FIGS. 1 and 2, an insulating region 3 extending from the substrate to the surface of the epitaxial layer encloses a portion of the epitaxial layer, the surface part of which comprises both the contact zones of the terminals.

Region 3 has been formed in epitaxial layer 2 by a first operation in which P-type impurities are ionically implanted at high concentration in predetermined areas in the substrate and the impurities are subsequently diffused into the epitaxial layer during its growth, and a second operation after the growth of the epitaxial layer, in which P-type impurities are deposited at high concentration in areas on the surface of the epitaxial layer corresponding to the areas of previous implantation and diffusion of the aforementioned impurities in the aforementioned layer.

The process parameters have been chosen so that the diffusion zones from the substrate and from the surface of the epitaxial layer meet in a single insulation region P+ having a high concentration of P-type impurities.

In FIG. 1, the zone where the diffusion processes are superposed in indicated by a broken line.

A buried region 4 having P-type conductivity is disposed in the part of the epitaxial layer between the two contact zones of the terminals and extends into the epitaxial layer 2 from substrate 1.

The buried region has an elongated shape and is bounded at its ends by the insulating region 3. It is made by using the same process steps as in the first operation for forming the insulating region 3, i.e. by implanting P-type impurities in a predetermined area of the substrate, the impurities being subsequently diffused into layer 2 during its epitaxial growth.

In the part of the epitaxial layer between the two contact zones of the terminals there are also two separation regions 5 and 6 having P-type conductivity and extending into the epitaxial layer 2 from its surface.

The separation regions have an elongated shape and are bounded at the ends by the insulating region 3. They are formed so that the buried region 4 extends partly between them without being in contact with them.

Regions 5 and 6 are made by using the same process steps as in the second operation for forming the insulating region 3, i.e. by depositing P-type impurities in predetermined areas on the surface of the epitaxial layer and diffusing them into the layer.

The advantages of the invention are clear from the foregoing description of the structure of a device according to the invention and the process used for manufacturing it. Since separation regions 5 and 7 alternate with the buried region 4, there is a great reduction in the "useful thickness" of the epitaxial layer, whereas its effective thickness is determined by the process for manufacturing the entire integrated circuit containing the device. This reduction in useful thickness, together with an increase in the average length of travel of the charge carriers between one terminal and the other, means that higher resistances can be obtained for a given integration area.

Since the separation regions 5 and 6 and the buried region 4 extend into the epitaxial layer 2, it can be completely depleted, so that the device acts as a constant current generator when the threshold value of the voltage applied between the two terminals is less than that necessary for the described known device, for given values of the generated current.

A particularly important fact is that a device according to the invention can be constructed without any additional process step as compared with a prior-art device, since the separation regions and the buried region are formed by the same steps as used in the process for forming the insulating region.

Although only one embodiment of the invention has been illustrated and described, numerous variants are of course possible without departing from the scope of the invention. For example, the number of separation regions and buried regions can be larger provided they alternate with one another.

We claim:

1. A buried-resistance semiconductor device having two terminals formed in a chip of semiconductor material, said device comprising: a substrate having a first type of conductivity and bounded by a first main surface of said chip; a layer having a second type of conductivity disposed on said substrate and bounded by a second main surface of said chip two contact zones on which said two terminals are disposed being defined in a surface portion of said layer; an insulating region having said first type of conductivity extending from said substrate to said second main surface of said chip and bounding a portion of said layer extending from said substrate to said second surface of said chip; wherein, in part of said layer located between said two contact zones are at least two separation regions having said first type of conductivity and extending from said second main surface of said chip into said layer; and wherein, a buried region is provided having said first type of conductivity and extending from said substrate to a predetermined extent between said separation regions without being in contact with them, said separation regions and said buried region having an elongated shape and being bounded at their ends by said insulating region.

* * * * *